United States Patent Office 3,016,297

Patented Jan. 9, 1962

3,016,297

PHOTOPOLYMERIZABLE COMPOSITIONS COMPRISING POLYMERIC CHELATES AND THEIR USE IN THE PREPARATION OF RELIEFS

Walter E. Mochel, Bellevue Manor, and Louis Plambeck, Jr., Shipley Heights, Del., assignors to E. I. du Pont de Nemours and Company, Wilmington, Del., a corporation of Delaware No Drawing. Filed Feb. 13, 1956, Ser. No. 564,873
13 Claims. (Cl. 96—35)

This invention relates to new photopolymerizable polymeric compositions and to the preparation of printing reliefs therefrom.

Solid compositions capable of polymerization under the influence of actinic light to give rigid, insoluble, tough structures are of importance, especially in making printing reliefs, as described and claimed in the copending application of Plambeck, Ser. No. 326,841, filed December 12, 1952 (U.S. Patent 2,760,863, dated August 28, 1956). See Belgian Patent 525,225 of June 19, 1954. In this process printing plates with uniform printing height are produced directly by exposing to actinic light through an image-bearing process transparency (negative or positive), a layer of an addition polymerizable, ethylenically unsaturated composition having intimately dispersed therethrough an addition polymerization initiator activatable by actinic light, the layer being substantially transparent to actinic light and being superposed on and adherent to a suitable support, e.g., a metal plate or foil, until substantially complete polymerization of the composition occurs in the exposed areas but substantially no polymerization occurs in the non-exposed areas. Removal of the layer in the non-exposed areas, e.g., by treatment with a suitable solvent in which the polymerized composition in the exposed areas is insoluble, leaves a printing relief of the text of the transparency suitable for letterpress work.

Solid photopolymerizable layers have in the past been prepared by two general methods. The first of these involves partial pre-polymerization of the unsaturated composition to the desired solid stage or the addition of sufficient quantities of a preformed saturated polymer to attain the desired solidity. In the second method, some or all of the polymerizable component is polymeric in nature, such as the addition polymerizable, unsaturated polyesters, including the alkyds, and, more recently, the polyvinyl alcohol acetals with lateral, terminal, conjugated vinylidene groups; the polyvinyl alcohol acetals and/or esters with lateral, non-terminal, polymerizable ethylene groups; and the salts of a polymerizable salt-forming monomer with a complementary salt-forming polymer—see, respectively, the copending applications of Martin, Ser. No. 461,291, filed October 8, 1954, U.S. Patent 2,929,710, March 22, 1960; Ser. No. 528,277, filed October 3, 1955 (U.S. Patent 2,892,716, June 30, 1959); and Barney Ser. No. 529,903, filed August 22, 1955 (U.S. Patent 2,893,868, July 7, 1959).

Both of the above methods are effective. However, in their use it is at times difficult to produce printing plates of the desired high quality since they depend, for development after exposure, on a difference in solubility either between a polymerizable monomer/saturated polymer composition (which to be solid must be largely the latter) and the completely polymerized composition or between a polymerizable polymer and the completely polymerized composition, alone or with other combined monomers. This difference in solubility of necessity gives an undesirably slim margin, even with the ionic crosslinked products of Patent No. 2,893,868, since the difference is only that in the solubility of two solid polymeric compositions, one more highly or completely polymerized, or preferably crosslinked, than the other.

This invention has as an object the preparation of new addition polymerizable polymeric compositions. Another object is the preparation of such compositions which are soluble in a special class of organic solvents but can be converted, by addition polymerization, to crosslinked polymers insoluble in said solvents. A further object is to provide such compositions which are capable of polymerization with the aid of actinic light, to shaped objects. Still another object is the provision of compositions which can be used to make relief images and particularly printing reliefs by photopolymerization. A still further object is to provide new processes for making printing reliefs. Other objects will appear hereinafter.

These objects are accomplished by the present invention of essentially transparent, solid, photopolymerizable compositions having, as their essential components (A) A solid polymeric chelate of a polyvalent metal, (B) A vinylidene group containing, addition polymerizable component, and, uniformly dispersed therethrough, (C) An addition polymerization initiator activable by actinic light.

A further aspect of the present invention is that of polyligands containing a plurality of ligand structures and in addition an addition polymerizable ethylenic linkage preferably a vinylidene group or a vinylene group between two esterified carboxyl groups. A still further aspect of the invention is that of polychelates of such polyligands with a polyvalent metal, the valence of the metal plus the number of ligand structures totalling at least 5. The polyvalent metal polymeric chelate may itself contain a vinylidene group, i.e., components A and B may be the same. The solid photopolymerizable compositions of this invention exhibit an optical density less than about 1.5 in a 3-mil layer, i.e., less than about 0.5/mil, and less than 5.0 to the available actinic light.

The chelate polymer is preferably present in amount at least 50% by weight of the whole composition. The amount of the vinylidene component which is necessary depends on the nature of the chelate polymer. With linear polychelates the vinylidene-containing component must be present in amount such that at least 5% and preferably at least 10% by weight of the composition as a whole is the vinylidene, $CH_2{=}C{<}$, group but with crosslinked chelates as little as 0.5%, but preferably at least 1%, of the composition as a whole must be the vinylidene group. For the unsaturated polychelates, whether internally or terminally unsaturated, the necessary amounts, if any, of any added vinylidene-containing component varies with the proportion of vinylidene groups in the said unsaturated polychelate but the above minimum requirements are to be met.

Crosslinked polychelates are preferred since greater insolubility is achieved in such compositions on polymerization as contrasted with linear polychelates. Compositions containing unsaturated polychelates, particularly crosslinked unsaturated polychelates, are especially preferred because of the extremely insoluble nature of the addition and chelate crosslinked polymers resulting therefrom on polymerization. Because of improved chelate setting time and better image quality, the internally unsaturated crosslinked polychelates are preferably made from internally unsaturated polyligands having a unit weight per ligand group less than 1000 and preferably less than 700, and a unit weight per internal polymerizable double bond less than 500 and preferably less than 400.

Due to the greater speed with which the extremely insoluble addition and chelate crosslinked structure is achieved, the vinylidene-containing crosslinked polychelates are particularly outstanding. Thus compositions containing (A) a polymerizable polymeric polychelate carrying a plurality of vinylidene groups whereby said polychelate is polymerizable are preferred, particularly such a polymer with chelate crosslinks; (B) a polymerizable monomer or polymer containing a plurality of vinylidene groups; and (C) a free radical generating addition polymerization initiator activatable by actinic light are preferred. Mixtures of all or any of the various type components can be used provided the necessary minimum amount of vinylidene groups is present.

The invention has, as a further aspect, elements suitable for the preparation of printing relief images, these elements comprising a support having superposed thereon a layer of a solid photopolymerizable composition as defined above. The invention further includes the process of selectively addition-polymerizing the above defined compositions by exposing them to actinic light, as well as the more detailed process of preparing a printing relief by exposing the above-defined photopolymerizable elements to light under an image-bearing process transparency and treating the addition-photopolymerized composition with a liquid composition which displaces the metal from the chelate groups in the polymer, i.e., those portions of the polymer not exposed to the light, the liquid composition being also a solvent for the organic portion of the chelated polymer, whereby the chelate links are broken and the unexposed areas of the composition are removed.

The present invention involves chelate chemistry. This has been developed for the most part in recent years and a number of reviews thereof are available, e.g., "The Chelate Rings," Diehl, Chem. Rev. 21, 39–111 (1937), "Chemistry of the Metal Chelate Compounds," Martell and Calvin, Prentice-Hall, New York, 1952, and Gilman, "Organic Chemistry—An Advanced Treatise," Wiley, 2nd Ed., 1943, pages 1868–1883. In chelate compounds a metallic element is linked in one or more ring structures, each ring normally of five or six members, with a chelating or chelate-forming compound, i.e., ligand, which contains at least two electron donor groups so located with respect to one another that they are capable of forming a ring structure, i.e., the chelate ring, with the central metal atom. The principal electron donor groups are given in Diehl, supra, page 43, and Martell and Calvin, supra, page 186. Electron donor groups necessary for chelate ring formation are, in general, those of the strongly non-metallic elements of groups V–A and VI–A of the periodic table, especially those within the atomic number range 7–16. The more important donor groups and the chelate forming structures therefrom contain nitrogen, oxygen, and/or sulfur as donor atoms, oxygen being the most common. A typical (and preferred) simple ligand or chelate forming structure is the

—CO—C—CO— structure found for example, in β-ketoesters. Thus ethyl acetoacetate forms with a metal of valence *n*, a chelate represented by the structure

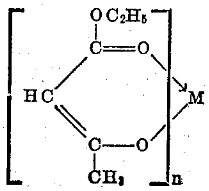

wherein M represents the metal of valence *n* and the arrow indicates a coordinate bond. Organic compounds containing a plurality of chelate forming structures which are necessary for the preparation of the polychelates of this invention have therefore, at least two ligand functions and are most simply referred to as polyligands, i.e., monomers or polymers containing a plurality of ligand groups, e.g., the preferred 1,3-dicarbonyl-containing ligand groups, e.g., β-ketoester groups or β-diketo groups.

The organic ligand forming the chelate ring with the metal is not bonded to the metal atom through carbon, but rather through the strong electron donor atoms of the donor groups, e.g., the aforesaid strongly non-metallic elements of groups V–A and VI–A, as illustrated above by oxygen. The most usual chelate rings have from five to six members and are the most stable. The organic compounds forming the ligand or polyligand needed for chelate or polychelate formation will thus have the two donor atoms in each ligand group separated by two or three other atoms, usually carbon. In the final chelates the metal and the two donor atoms thus account for three contiguous ring members of each chelate group.

Conventional electron donor groups wherein the donor atom is one of the class nitrogen, oxygen, or sulfur include compounds containing keto, thioketo, hydroxyl, thiol, carboxyl, carbothiolic, imino, or oxime groups, with the two necessary donor atoms being alike or different. The preferred groups, because of their generally higher chelating tendencies, are those wherein the donor atom is oxygen, usually carbonyl or hydroxyl oxygen, including oxime and enolized carbonyl groups. The most preferred ligand groups contain two oxygen-based donor groups linked either directly or joined together through one or more additional carbons, of which probably the most common are the dicarbonyl and mixed carbonyl/hydroxy ligands. In these ligands, the carbonyl groups are found in ketone, aldehyde, carboxyl and carboxyester linkages, while the hydroxy groups are found as such or in enolized forms of carbonyl groups.

An polymeric chelate of a polyvalent metal, whether linear or crosslinked, saturated or unsaturated can be employed. The simplest are the linear saturated polychelates, e.g., those disclosed and claimed in U.S. 2,659,711 which have the structure

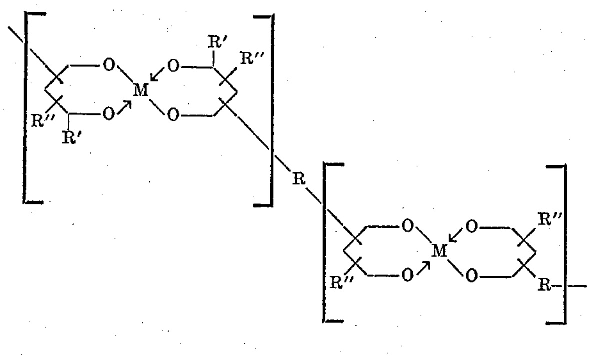

with one, or the other, or both type chelate units, wherein M represents a metal having a formal valence of two and a coordination number of four, R is a divalent hydrocarbon radical of at least four carbons, R′ is a monovalent hydrocarbon radical, and R″ is hydrogen or a monovalent hydrocarbon radical. These linear polychelates can be prepared readily by reacting a bis-1,3-diketosubstituted organic compound in which the two, 1,3-diketo ligand functions are joined by a divalent hydrocarbon radical of at least four carbons with a suitable compound of said metal, e.g., a salt of the enol form of a 1,3-diketone, i.e., a 1,3-dicarboxyl structure in its enol form, wherein the tetraketone forms a stronger enolate than the diketone. Suitable tetraketones includes those of the structures

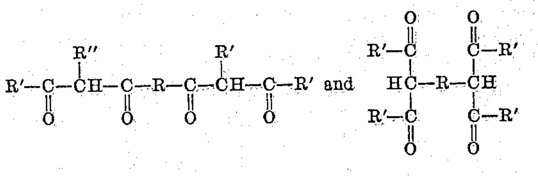

wherein R, R' and R'' are as above. Suitable specific examples of such polymers include the polymeric beryllium chelates from 4,4'-bis(acetoacetyl)diphenyl ether, 1,8-bis-(benzoylacetyl)octane, and the like.

The next simplest polychelates for use as the polymeric component of these new compositions are the crosslinked, saturated polychelates, such as certain of those described in the copending application of Hoover and Miller, Ser. No. 535,520, filed September 20, 1955, U.S. Patent 2,933,475, April 19, 1960, or in U.S. 2,620,325; 2,634,253; 2,647,106, and the like. Generally speaking, these crosslinked saturated polychelates are the chelates of polyligands and polyvalent metals, where the polyligand carries more than two ligand functions and/or the chelate forming metal has a formal valence greater than two and a coordination number greater than four. Generally speaking, the preferred polyligands are polyesters wherein the ligand functions, i.e., chelate forming structures, are 1,3-dicarbonyl structures, either as such or in their enol forms.

Probably the simplest method of preparing these crosslinked, polymeric polychelates is that of the above Hoover and Miller application. In this method solution of (1) a polyligand containing $m$ ligand functions per molecule and (2) a chelate of a volatile ligand with a polyvalent metal of formal valence $n$, where $m$ and $n$ are integers, alike or different, each greater than one and the sum of which is at least five, is formed and the volatile chelating agent thereby formed as well as any solvent present is thereafter evaporated leaving a solid polymer crosslinked through polyvalent metal chelate groups. The formation of chelate crosslinkages, that is, of a space network of chelate linkages, derives from the reaction of two polyfunctional reactants, of which at least one is more than bifunctional. The volatile ligand of the Hoover and Miller invention is an organic compound containing one (and generally only one) ligand function and having a normal boiling point below 300° C., i.e., at atmospheric pressure. Numerous such volatile ligands are known, among the most common of which are those having a 1,3-dicarbonyl structure, e.g., acetylacetone or ethyl acetoacetate.

The relative proportion of the polyvalent metal chelate of a volatile ligand with respect to the polyligand is not critical. However, it is desirable that there be enough of the metal chelate present to react with at least 10%, or better, at least 25% of the chelatable structures of the polyligand. Preferably, enough of the simple metal chelate is used to react with approximately all of the ligand groups of the polyligand. An excess of the metal chelate can be used if desired, e.g., up to three times the calculated amount, or even more. A solvent is not necessary when the two components are liquid and compatible. However, it is in general desirable to use enough of a mutual solvent to produce a fluid, homogeneous solution. Any inert, volatile solvent can be used. Preferably, the solution is as concentrated as possible, consistent with a practical viscosity.

In solution an equilibrium is established between the reactants (polyligand and simple metal chelate) and the products (chelate crosslinked polymer and volatile ligand), the formation of the chelate crosslinked polymer being favored. Evaporation of the volatile ligand allows the reaction to go to completion. The net result is a ligand exchange, which is also termed chelate interchange or transchelation, i.e., an exchange, or transfer, of the metal from the chelating structure of the volatile ligand agent to those of the non-volatile polyligand. To illustrate, the transchelation between the ethyl acetoacetate chelate of a divalent metal and a polyester polyligand having a plurality of 1,3-dicarbonyl structures, e.g., acetoacetoxy groups, may be represented by the following equation, wherein M represents the metal, Pol. represents the polyligand molecule to which the chelate forming structures are attached, and the ring arrows represent the coordinate bonds:

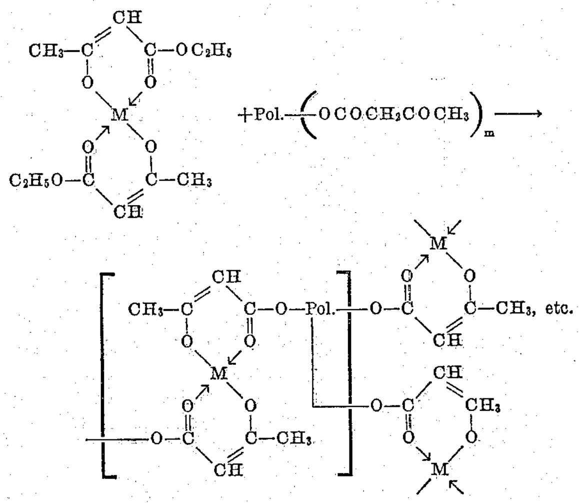

When the number $m$ of chelate forming structures per polyligand molecule and the formal valence $n$ of the metal are each at least two, a polychelate is formed. When the sum of $m$ and $n$ is at least five, as is required here, i.e., $m$ is at least three, crosslinking through the chelate rings occurs between the polymer molecules. In the transchelation procedure, evaporation of the volatile ligand and any accompanying solvent, followed by air-drying or, if desired, moderate baking, leaves a chelate-crosslinked polymer containing the metal which was present in the simple chelate of the volatile ligand. This method is illustrated in Examples I–X below.

Another method of preparing the chelate-crosslinked polymeric components is based on an ester interchange reaction. In this method, the starting material need not contain chelating structures, i.e., it need not be a ligand, although chelating structures can also be present. It is only necessary that the starting material, which may be monomeric or polymeric, contain a plurality of free functional active hydrogen containing groups, e.g., hydroxyl, groups. When such a material is reacted with a simple chelate of a polyvalent metal of formal valence, $n$ and a volatile ligand, as defined above, said volatile ligand having complementary, reactive functional groups, e.g., ester groups (e.g., a polyvalent metal chelate of ethyl acetoacetate), an ester interchange takes place with liberation of the corresponding interchange product, e.g., an alcohol corresponding to the more reactive portion of the volatile simple, ligand, such as the hydrocarbonoxy portion, e.g., the alkoxy portion, and formation of chelate linkages uniting the molecules of the polyfunctional, e.g., polyhydroxy, compound.

This reaction also is a result of an equilibrium between the reactants (material containing a plurality of reactive, functional, active hydrogen containing groups and a simple chelate of a polyvalent metal) and the products (a chelate-crosslinked polymer and a simple molecule corresponding to the active hydrogen of the said functional groups and the complementary portion of the simple chelate). This is illustrated by the following equation between a simple divalent metal (M) chelate, e.g., a bis- (ethyl acetoacetato) metal chelate, and a polyhydroxy compound represented by Pol. $(OH)_m$ resulting in a chelate crosslinked polymer:

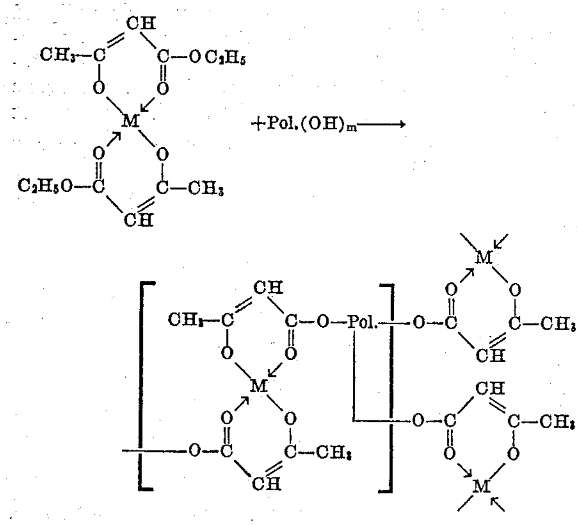

In this structure both the number of functional, e.g., hydroxyl, groups and the principal valence $n$ of the metal are at least two, and the sum of $m$ and $n$ is at least five. Therefore, crosslinking through the chelate rings takes place between the polymer molecules and, as is obviously apparent, the polymers so obtained are superficially overall identical in structure with those obtained by the preceding method. Evaporation of the alcohol formed and of any other volatile material leaves the chelate crosslinked polymer containing the metal which was present in the chelate of the volatile ligand. This method is illustrated in Examples XI and XII below.

As indicated above, the preferred polymeric chelate components for use in the new compositions of this invention are those carrying addition polymerizable ethylenic unsaturation, especially lateral vinylidene groups, since such polymeric components when polymerization is induced result in an extremely insoluble space network structure which is both addition and chelate crosslinked. These unsaturated polychelates, preferably polyester polychelates, whether internally (i.e., vinylene) or externally (i.e., vinylidene) unsaturated, can be made using processes like those described previously for the saturated polychelates but employing appropriate unsaturated reactants. They can most readily be prepared in the manner of the aforesaid Hoover and Miller copending application but employing polyligands which carry internal, i.e., vinylene, or terminal, i.e., vinylidene, unsaturation or simple functional groups through which the unsaturated groups can be incorporated into the structure by simple chemical reactions. These methods are illustrated in detail in Examples I–IX and XI and XII. The vinylidene-substituted chelate-crosslinked polymers, particularly the polyesters, are especially preferred since these polymeric components, once polymerization is induced, lead with extreme rapidity to a chelate and addition crosslinked, space network structure, which is especially insoluble, therefore permitting short exposure times and rapid development—see Examples VIII and IX.

The polymeric polychelates of all types are infusible and insoluble in the common solvents because of their polymeric chelate structure, which is especially true for the chelate crosslinked compositions. Only certain special classes of solvents can solubilize the polymeric chelates. It is to be noted that such solubilization is not simple dissolution in the normal sense but rather hinges on scission of one or more of the metal chelate links in the polymeric chelate chains through a special procedure. One such class of solubilizing agent is that of the liquid, monomeric chelating agents, that is, the already mentioned volatile simple ligands, e.g., simple molecules containing a 1,3-dicarbonyl unit in their structure. These materials reverse the equilibrium and break the chelate linkages, removing the metal in the form of a monomeric, simple chelate with the simple ligand used. In the unexposed and thus not further polymerized areas this leaves the original polyligand (monomeric or polymeric) without chelate linkages which polyligand can now be dissolved by conventional solvents, e.g., the volatile ligand, or another common solvent simultaneously present. In the exposed areas the addition polymer formed therein on exposure, whether crosslinked or not, protects the chelate polymer from such attack. Another class of solvents capable of solubilizing the chelate polymers by breaking the chelate linkages and removing the metal comprises an organic solvent, e.g., an alcohol, ester or ketone, having dissolved therein sufficient (i.e., at least stoichiometric with the metal in the unexposed area) quantities of a very strong acid, i.e., an acid of dissociation constant of at least $1 \times 10^{-2}$, to dissolve the metal present in the chelate crosslinkages in the unexposed area.

The molecular structures involved in the various polychelates are diagrammatically depicted below. In these diagrams ———X indicates an addition polymerizable carbon to carbon terminal double bond, i.e., a vinylidene group; ———X——— indicates a similar but non-terminal, i.e., internal double bond; Ch represents a chelating structure, i.e., a ligand group, sometimes in its chelate form and sometimes not, as will be apparent later; and M represents a polyvalent metal, which for the linear polychelates must have a formal valence of two and coordination number of four and for the crosslinked polychelates preferably has at least a higher formal valence than two and preferably a coordination number greater than four. The requirements for a crosslinked polychelate are also discussed later. Thus, the chelate polymer types can be represented by the following typical structures:

(1) Saturated, linear polymeric polychelates especially those wherein the chelate linkages are those of 1,3-dicarbonyl units, e.g., those of U.S. 2,659,711, supra, of the schematic structure:

———Ch—M—Ch—————Ch—M—Ch———

(2) Saturated, chelate crosslinked polymers, e.g., metal crosslinked polychelates of polyesters having lateral ligand substituents, especially those wherein the chelate linkages are those of 1,3-dicarbonyl units, of the schematic structure:

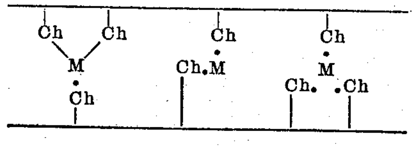

Typical examples of these are polyvinyl alcohol acetoacetates chelated with nickel, aluminum, or both; polyglycerol phalate benzoylacetates, chelated with chromium or manganese, or both, and the like. Of course, the chelate linkages are not necessarily the only crosslinks in such polymers. For instance, in the last named alkyd-based polymers, the degree of esterification can be carried higher than the indicated two, thereby establishing some ester crosslinks, provided the polymers are soluble and some free hydroxyl groups remain to permit introduction of the benzoylacetato ligand groups and formation therethrough of the necessary indicated chelate crosslinks.

(3) Internally, i.e., non-terminally, unsaturated polymeric polychelates, preferably chelate crosslinked, e.g., metal crosslinked polychelates of addition polymerizable, internally unsaturated polyesters having lateral ligand substituents, especially those wherein the chelate linkages are those of 1,3-dicarbonyl units of the schematic structure:

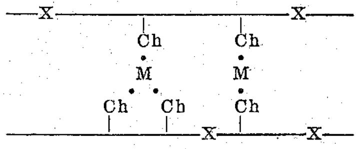

Typical examples of these are nickel or iron chelate crosslinked glycerol maleate benzoylacetates, pentaerythritol citraconate phthalate acetoacetates, and the like. Again, the chelate linkages are not necessarily the only crosslinks in such polymers. For instance, in the alkyd-based polymers, the degree of esterification can be carried higher than the indicated values, thereby establishing some ester crosslinks, provided the polymers are soluble and there are some free hydroxyls remaining to permit introduction of the benzyl- or acetoacetato ligand groups. Furthermore, such polymers are not limited to the alkyd polyesters; for instance, a partially hydrolyzed polyvinyl acetate polymer or a partially hydrolyzed polyvinyl acetate copolymer with some of the hydroxyl groups esterified with crotonate and acetoacetato or benzoylacetato groups and chelate crosslinked illustrates another type. In addition, this latter type of polyvinyl alcohol ester derivative can also contain some ester crosslinks, e.g., phthalate crosslinks, if desired. Furthermore, in this class of non-terminally unsaturated polymeric polychelates, preferably chelate crosslinked, the internal unsaturation does not have to be present in either the main polymer chain or the lateral crosslinked ester chains between the carboxyester linkages, although such polymers are much preferred. It is intended to include within this class of polymers those wherein the internal polymerizable ethylenic unsaturation is in the chelate-forming ligand substituent, and therefore generally pendent on the main polymer chain. A suitable specific example of this latter type is a polyvinyl alcohol crotonylacetate. Such chelate crosslinked internally unsaturated polymers wherein the said unsaturation is between two carboxyester linkages are new compounds per se as are the polyligands therefor and form a part of this invention as illustrated in greater detail in the following examples.

(4) Vinylidene-substituted, polymeric polychelates, preferably chelate crosslinked, e.g., metal-crosslinked polychelates of addition polymerizable, terminally unsaturated polyesters having lateral ligand substituents, especially those wherein the chelate linkages are those of 1,3-dicarbonyl units, of the schematic structure:

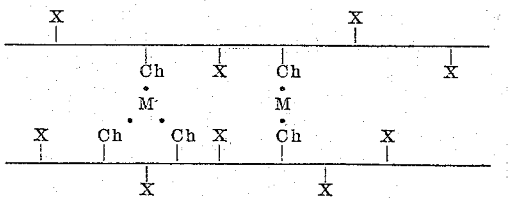

Typical examples of these polyesters are polyvinyl acrylate acetoacetates chelated with aluminum, copper, iron, and/or chromium; glycerol itaconate benzoylacetates chelated with titanium, aluminum, and/or zinc; pentaerythritol methylene-malonate acetoacetates chelated with the same or different metals; and the like. Of course, the chelate linkages are not necessarily the only crosslinks in such polymers. As before, particularly in the case of the last named alkyd-based polymers, the degree of esterification can be carried to a high enough point to establish some ester crosslinks provided the polymer is soluble and there are some free hydroxyls remaining to permit introduction of the benzoyl- or acetoacetato ligand groups. Similarly, in the case of the polyvinyl alcohol or other polyol derivatives, ester crosslinks can also be established through use of a dibasic saturated carboxylic acid such as phthalic acid. Similarly, the terminal, i.e., the vinylidene, unsaturation present in this type of polymer need not necessarily be pendent on the polymer chain solely through ester linkages. The terminal group can be pendent to the polymer chain through the lateral ligand substituent, such as for instance in the case of a polyol, e.g., a polyvinyl alcohol acryloylacetate. Such chelate crosslinked vinylidene-substituted polymeric polychelates, with or without internal ethylenic unsaturation between two carboxyester groups, are likewise new compounds per se as are the polyligands thereto and form a part of this invention, both as illustrated in greater detail in the following examples.

In the chelate crosslinked compositions, some of the chelate crosslinkages can be through divalent metals. Thus, the chelate crosslinked compositions do not necessarily have any polyvalent metal components of formal valence higher than two. All that is necessary is that the total of the formal valence of the metal or metals involved and the number of chelate-forming ligand structures per unit be at least five. Thus, a chelate crosslinked composition is formed from a divalent metal and a polyligand carrying at least three ligand structures per unit or vice versa, as well as from metals of higher formal valence and polyligands carrying at least two ligand structures per unit. The preferred are those from metals of formal valence greater than two with polyligands having at least two and especially more than two ligand structures per unit.

Since the new photopolymerizable compositions of the present invention must all contain an addition polymerization initiator activatable by the actinic light, e.g., benzoin, benzoin methyl ether, diacetyl, and the like, as is explained in greater detail herein, the following discussions of the new polychelate based compositions will be understood in every instance to include such an initiator. Since the new compositions of the present invention also must have a minimum percentage of polymerizable vinylidene component, which varies as indicated previously with the linear or crosslinked, saturated or unsaturated nature of the polymeric chelate component, these compositions corresponding to the above described chelate polymer types can be represented schematically in the same manner as follows:

(1) Saturated, linear polychelate compositions

——Ch—M—Ch——Ch—M—Ch—— plus ——X, and/or X——X, and/or

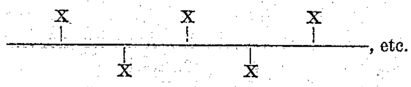

Typical examples of such compositions, wherein the polychelate is the preferred 1,3-dicarbonyl type, include the polymeric beryllium chelate from 4,4′-bis(acetoacetyl)-diphenyl ether/vinyl benzoate/divinyl adipate or the polymeric magnesium chelate from 1,8-bis(benzoylacetyl)-octane/ethylene diacrylate/glycerol maleate acrylate, and the like.

(2) Saturated, chelate crosslinked polymer compositions

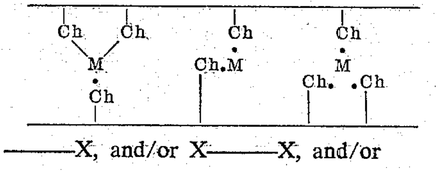

plus ——X, and/or X——X, and/or

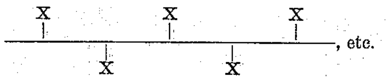

Typical examples of these compositions, wherein the polychelate component is one of the preferred class of polychelates, wherein the polymer structure is an ester structure and the chelate-forming ligand group are 1,3-dicarbonyl units, include aluminum and magnesium chelate crosslinked acetoacetatopolyvinyl alcohol/methacrylic acid/pentaerythritol tetramethacrylate or iron crosslinked glycerol phthalate benzoylacetate/polyethylene glycol methacrylate/pentaerythritol phthalate acrylate, and the like.

(3) Internally, i.e., non-terminally, unsaturated polymeric polychelates, preferably chelate crosslinked,

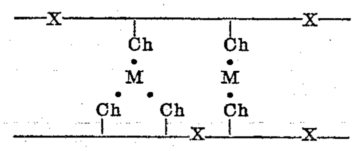

plus ———X, and/or X———X, and/or

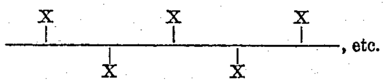

Typical examples of these compositions, wherein the non-terminally unsaturated addition polymerizable polymeric polychelates are polyesters and the chelate forming ligand units are 1,3-dicarbonyl units, include nickel crosslinked glycerol maleate acetoacetate/acrylamide/methylenebis-methacrylamide or polyvinyl alcohol crotonate benzoylacetate chelate crosslinked with magnesium and iron/polyethylene glycol maleate/ethylene glycol diacrylate, and the like.

(4) Vinylidene-substituted polymeric polychelates, preferably chelate crosslinked polymer compositions,

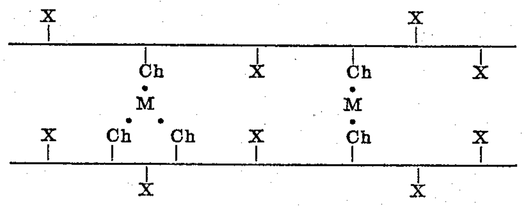

plus, if desired, ———X, and/or X———X, and/or

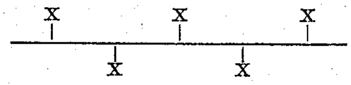

Typical examples of these compositions, wherein the terminally unsaturated polymeric polychelates are polyester polychelates and the chelate forming ligands are 1,3-dicarbonyl units, both of which are preferred types, include iron crosslinked pentaerythritol maleate acrylate acetoacetate/dimethyl $\Delta^4$-cyclohexene-1,2-dicarboxylate/diphenyl succinate or nickel crosslinked polyvinyl alcohol acryloylacetate acetate/glycerol phthalate methacrylate/polyethylene glycol maleate/diphenyl phthalate, and the like.

When saturated chelate polymers (Types 1 and 2) or non-terminally unsaturated chelate polymers (Type 3) are used there must be supplied to the compositions a minimum percentage, as defined previously, of a polymerizable vinylidene-containing component. The vinylidene groups can be present in simple monomers, or, more desirably, since the compositions set up more rapidly to insoluble cross-linked materials, by di- or polyvinylidene monomers indicated by X———X and

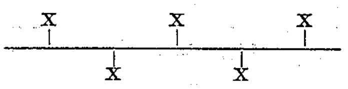

When vinylidene-substituted polychelates are used, added vinylidene monomer or polymer components may not be necessary. However, since the compositions generally set up even faster, it is usually desirable to have present one or more of the aforesaid defined polymerizable vinylidene-containing components.

It is also within the scope of this invention to have, either in the vinylidene-containing monomeric or polymeric components or the polymeric chelate components internal ethylenic unsaturation as represented in some of the following by ———X———. Such unsaturation, however, need not be present but does afford additional crosslinking sites for addition polymerization with the necessarily present terminal vinylidene groups. These compositions can be represented schematically in the same manner as follows:

(*a*)

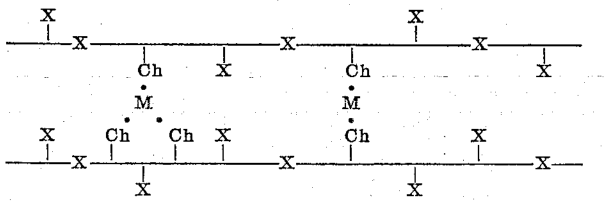

In this case, a polymeric material containing internal ethylenic and extralinear vinylidene groups and a plurality of chelating structures can be crosslinked by chelation. For example, an intrachain unsaturated polyester resin containing free hydroxyl groups is reacted both with ethyl acetoacetate and with methacrylyl chloride, and the resulting product is crosslinked by treatment with chelates, with a volatile chelating agent, of a mixture of a di- and a trivalent metal.

(*b*)

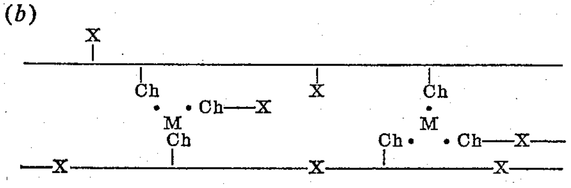

A mixture of two (or more) unsaturated polymeric materials can be used, one of which has terminal unsaturation, i.e., vinylidene groups, the other internal unsaturation, both species having a plurality of chelating structures as illustrated in (*b*) above. If desired, there can be, as above illustrated, additional unsaturation, either terminal or internal, in one of the groups attached to the chelating metal. This can be attained, for example, by using in the transchelation reaction a chelate of an unsaturated chelating agent, e.g., the aluminum chelate of allylacetoacetate, of the crotonic acid ester of $\beta$-hydroxyethyl acetoacetate, or the methacrylate of ethyl $\alpha$-hydroxyacetoacetate.

(*c*)

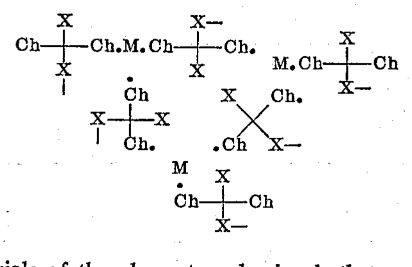

Materials of the above type having both terminal and non-terminal polymerizable unsaturation can be produced, for example, by reacting a monomeric material having two chelating structures and two unsaturated groups, alike or different, e.g., pentaerythritol crotonate/methacrylate/diacetoacetate (prepared by ester interchange between pentaerythritol and a 1:1:2 (molar) mixture of ethyl crotonate, methyl methacrylate and ethyl acetoacetate using an alcoholysis catalyst and a polymerization inhibitor) with a trifunctional metal chelate, e.g., tris(ethyl acetoacetato)aluminum. The photoinitiator, necessarily present in the photopolymerizable compositions of this invention, is preferably added to the composition prior to the formation of the polymeric chelate structure so as to be homogeneously dispersed within the solid composition. The same holds true for any other added component, e.g., a vinylidene-containing monomer or polymer.

When these new solid, polymeric chelate compositions containing the necessary vinylidene groups and the addition-polymerization initiator, preferably free radical generating, activatable by actinic light are exposed to such light transmitted through a process transparency thus resulting in exposed and non-exposed areas, the vinylidene groups in the exposed areas undergo addition polymerization rather rapidly establishing an additional wholly carbon chain structure in the solid compositions. Polymerization is continued until substantially complete in the exposed areas but with substantially none occurring in the unexposed areas. Thus, an entirely new carbon chain polymer is established in the exposed areas.

When the polychelate is a linear, saturated, solid polymeric chelate, this new carbon chain polymer is so intimately admixed and associated with the polychelate that the combination of the new carbon chain polymer and the initial linear, saturated polychelate in the exposed areas is not attacked by chelate dissolving materials; whereas, the polychelate in the unexposed areas is. Thus, development results in substantially complete removal of the initial composition in the unexposed areas without any attack in the exposed areas, thereby resulnitg in a printing relief of the desired fidelity.

When the polychelate is a crosslinked, saturated solid polychelate the operative association of the crosslinked polychelate and the newly formed wholly carbon chain polymer in the exposed areas is much greater since the new polymer is buried within and around the crosslinked chelate polymer structure. Development can accordingly be carried out much more vigorously with less chance of attack in the unexposed areas and the crosslinked polychelates are thus the preferred saturated polychelates. In both these cases, i.e., the saturated polychelates of the two types, it is preferred that the necessary vinylidene groups be supplied by polyunsaturated, polymerizable monomers or polymers, since such type monomers result in some crosslinked addition polymer in the exposed areas thereby resulting in an even more tightly involved addition polymer/polychelate structure in the exposed areas.

When the polychelate is an unsaturated polymeric chelate, light initiated addition polymerization in the exposed areas results in the establishment of addition polymer linkages between chelate polymer chains, i.e., the polymerized areas are both addition and chelate crosslinked. Such structures arise from both the internally unsaturated and the lateral vinylidene-substituted crosslinked polychelates. However, a more tightly crosslinked structure, is formed from the latter type more rapidly and therefore these constitute the most preferred polymeric chelate components of these new compositions. The degree and tightness of the addition and chelate crosslinked compositions in the exposed areas from such compositions increases markedly when the polyfunctional polymerizable monomers or polymers, particularly those having a plurality of non-conjugated terminal vinylidene groups are present and such compositions are the most preferred.

The following examples in which parts are by weight are illustrative of the invention:

EXAMPLE I

An unsaturated polyester resin containing free hydroxyl groups was prepared by reacting 95 parts (0.5 mol) of tetraethylene glycol, 68 parts (0.5 mol) of pentaerythritol, and 98 parts (1.0 mol) of maleic anhydride in the presence of 0.05 part of hydroquinone as stabilizer, following the general procedures outlined in Ind. Eng. Chem. 44, 11A (No. 3) (1952). The mixture was heated at 160° C. in a slow stream of nitrogen for 4.6 hours until a thick, viscous syrup was obatined. By this time the evolution of water had practically ceased. The weight of product was 237 parts compared to a theoretical yield of 245 parts assuming no loss by volatilization other than water formed in the reaction. The hydroxy-containing tetraethylene glycol/pentaerythritol/maleate polyester resin obtained was insoluble in toluene and styrene, difficultly soluble in acetone, and easily soluble in dioxane.

A resinous polyligand having a plurality of chelate-forming acetoacetate groups was prepared by heating a solution of 143 parts of the above resin (ca. 0.58 mol of hydroxyl groups), 100 parts (0.77 mol) of ethyl acetoacetate, and 100 parts of dioxane under a short fractionating column. A slow stream of nitrogen into the still pot served to exclude oxygen and provide agitation. After approximately 90 parts of distillate had been collected, 87 parts of toluene was added to the still pot and distillation continued. There was no precipitate formed on addition of the toluene although the original resin was insoluble in this solvent. After an additional 60 parts of distillate had been collected the pressure was reduced to 10–15 mm. and the mixture heated at 145–150° C. (still pot temperature) until no more distillate appeared. Some resin was lost by foaming during this treatment. The yield of product, i.e., the unsaturated polyester polyligand with a plurality of lateral chelate-forming acetoacetate groups, was 177 parts (92% of theory).

To 10 parts of the above unsaturated polyester polyacetoacetate were added 3 parts of dioxane, 1 part of the dimethacrylate esters of a mixture of polyethylene glycols of 200 average molecular weight (this component furnishing the necessary vinylidene groups) and 0.1 part of benzoin methyl ether. A clear solution was obtained. To this was added a solution of 4.2 parts of tris(ethyl acetoacetato)aluminum dissolved in 4 parts of dioxane. The mixture, which began to thicken in less than a minute, was cast on a levelled glass plate and allowed to stand. The layer was a firm gel in less than 15 minutes. After standing overnight in an air current to evaporate the solvent, there was obtained coated on the plate a hard, dry, and glass-clear, ca. 45 mils thick film of the unsaturated polyester polyacetoacetato crosslinked aluminum chelate/dimethacrylate/benzoin methyl ether composition containing about 1.3% vinylidene groups.

The above chelate-crosslinked resin film, covered with a process negative on film, was placed on a turntable revolving at 4.5 r.p.m., and exposed to ultraviolet light from three RS mercury vapor lamps and one S-4 sunlamp arranged 10–15 inches above the surface of the turntable. After an exposure of 15 minutes the plate was placed in a tray of acetylacetone and allowed to stand for two hours without agitation. During this time, the chelate-crosslinked resin in the unexposed areas dissolved in the acetylacetone, a chelating agent which breaks the chelate rings in the polychelate by forming the simple tris(acetylacetonato)aluminum and at the same time dissolves the non-addition crosslinked polymer, which is the residue of the broken polychelate, leaving the chelate and addition crosslinked resin forming a sharp relief image of the clear areas of the negative bound to the glass plate.

EXAMPLE II

Steel plates were sprayed with a black pigmented polyvinyl butyral wash primer and dried. A thin layer of a viscous liquid consisting of 55 parts of methyl methacrylate monomer, 25 parts of polymethyl methacrylate, 20 parts of the monomeric polyethylene glycol dimethacrylate mixture described in Example I of U.S. Patent 2,468 094, and 1 part of benzoin was coated on the primer and photopolymerized. The polymer layer thus obtained is especially adapted to anchor the image produced in the subsequent photopolymerization of a chelate-crosslinked polymer.

A mixture of 10 parts of the resin unsaturated polyester acetoacetate polyligand of Example I, 4 parts of the dimethacrylate of a mixture of polyethylene glycols of 200 average molecular weight, 0.14 part of benzoin methyl ether, 12 parts of dioxane, and 4 parts of tris-(ethylacetoacetato)aluminum was cast onto the prepared steel plate. In about ten minutes the solution had set to a soft gel and after overnight drying there was obtained a clear, hard layer of the unsaturated polyester polyacetoacetato cross-linked aluminum chelate/dimethacrylate/photoinitiator composition containing about 4.2% vinylidene groups superposed on the methacrylate polymer coated, primed metal plate.

The layer was exposed for 30 minutes under a line negative to the same light source used in Example I. The exposed plate was rocked in a tray of ethyl acetate/ethanol/ethyl acetoacetate (85/15/100) mixture which removed the unexposed portions completely, leaving addition and chelate-crosslinked polymer forming in faithful detail a raised printing relief of the text of the negative firmly bound to the base.

EXAMPLE III

A mixture of 14 parts of the resin unsaturated polyester acetoacetate polyligand of Example I, 6 parts of diallyl phthalate, 0.2 part of benzoin methyl ether, and 6 parts of dioxane was mixed with a solution of 4.2 parts of tris(ethyl acetoacetato)aluminum in 6 parts of dioxane. The solution was immediately applied to glass plates with a doctor knife. A firm gel formed in a few minutes. After aging for 20 days there was obtained coated on the plate a glass-clear, film of the unsaturated polyester polyacetoacetato crosslinked aluminum chelate/diallyl phthalate/photoinitiator composition containing about 6% vinylidene groups. The film was then exposed to the light source of Example I for 20 minutes under a line negative. The exposed plate was then brushed for five minutes with an ethyl acetate/ethanol/hydrochloric acid (85/15/10) mixture which dissolved the polychelate layer in the unexposed areas leaving the addition and chelate-crosslinked polymer in the exposed areas forming an excellent relief image of the text of the negative with sharp edges, deep recesses, and good rendition of fine detail.

EXAMPLE IV

By the procedure outlined in Example I an unsaturated polyester acetoacetate polyligand was prepared from a diethylene glycol/glycerol/maleate (mol ratio 10/1/10) polyester. To 14 parts of this polymerizable polyligand was added 6 parts of triallyl cyanurate, 0.2 part of benzoin methyl ether, and a solution of 1.85 parts of tris(ethyl acetoacetato)aluminum in 6 parts of dioxane and the resultant mixture cast onto glass plates. Gelation was slow (2–3 hours) and the gel obtained was soft and slightly tacky. After standing for 24 hours, there was obtained coated on the plate a firm, dry film of the unsaturated polyester polyacetoacetato crosslinked aluminum chelate/triallyl cyanurate/photoinitiator composition containing about 9% vinylidene groups. The plate was exposed to the light source of Example I for 20 minutes under a line negative. The exposed plate was then covered with the acid developing solution of Example III in a tray, rocked gently therein at room temperature for ten minutes, removed, rinsed and dried. The developer dissolved the polychelate layer in the unexposed layers leaving the addition and chelate crosslinked polymer in the exposed areas forming a raised relief image of the text of the negative with sharp edges, deep recesses, and a hard surface.

EXAMPLE V

By the procedure outlined in Example I, an unsaturated polyester acetoacetate polyligand was prepared from a diethylene glycol/glycerol/maleate (mol ratio 9/2/10) polyester. A solution of 10 parts of this polymerizable polyligand, 2 parts of the dimethacrylate of a mixture of polyethylene glycols of 200 average molecular weight, and 0.12 part of benzoin methyl ether in 3 parts of dioxane was mixed with a solution of 2.43 parts of tris(ethyl acetoacetato)aluminum in 3 parts of dioxane and the combined solutions cast onto glass plates. Gelation required about two hours. After standing for five days, there was obtained coated on the plates slightly tacky films of the unsaturated polyester polyacetoacetato crosslinked aluminum chelate/dimethacrylate/photoinitiator composition containing about 2.4% vinylidene groups. A 15-minute exposure of one plate to the light source of Example I under a line negative followed by development as in Example IV gave a good, sharp image but there were indications of slight underexposure. Others of the remaining plates after storage for eight months in the dark were similarly exposed but for 25 minutes and developed as in Example IV leaving the chelate and addition crosslinked polymer in the exposed areas forming a raised relief image of the text of the negative with sharp edges, deep recesses, and good rendition of fine detail.

EXAMPLE VI

To a cold (5° C.) solution of 24 parts of the polymerizable acetoacetate polyligand of Example V was added 8 parts of diallyl phthalate and 0.32 part of benzoin methyl ether in 15 parts of dioxane. There was added a cold (5° C.) solution of 8 parts of bis(butyl acetoacetato)nickel in 24 parts of dioxane and the mixture cast onto glass plates with gelation occurring in 10 minutes. After two hours, there was obtained coated on the plates clear, green, very firm films of the unsaturated polyester polyacetoacetato crosslinked nickel chelate/diallyl phthalate/benzoin methyl ether/photoinitiator composition containing about 5% vinylidene groups. The plates were stored in the dark for 20 days and then exposed to the light source of Example I under a line negative. Exposures of 15, 25, and 35 minutes were used and the plates developed for 3 minutes as in Example IV. The reliefs from the 15- and 25-minute exposures showed evidence of underexposure but the product from the 35-minute exposure had chelate and addition crosslinked polymer in the exposed areas only forming a raised relief image of the text of the negative with sharp edges and deep recesses.

EXAMPLE VII

For the chelate crosslinked compositions, the speed of setting of the photopolymerizable compositions by chelate linking, i.e., the speed of formation of the chelate polymer, depends to a large extent on the amount of chelate-forming ligand groups present in the polyligand being used which is conveniently expressed in terms of unit weight of polyligand per ligand group. It has been found that, in order to achieve setting (chelate-crosslinking) within a practical time, the unit weight per ligand group should not appreciably exceed about 1000 and should preferably be less than about 700. For the internally unsaturated cross-linked polychelates, the quality of the relief image formed by addition polymerization depends to a large extent on the amount of polymerizable ethylenic double bonds present in the unsaturated polyligand being used, which is conveniently expressed in terms of unit weight of the polyligand per polymerizable double bond. It has been found that, in order to obtain relief images of satisfactory sharpness, the unit weight of polyligand per polymerizable double bond should not appreciably exceed about 500, and should preferably be less than about 400.

These points are illustrated in this example, which summarizes the results with respect to setting time, film properties and image quality of a number of representative compositions having various polyligand unit weights per polymerizable double bond and per ligand group. These polymers, listed in the table below, all contained lateral acetoacetate groups as a representative ligand group and were prepared by the process outlined in the preceding examples. These polymers were tested by making in each case a standard composition of 10 parts of the polymerizable polyligand, 2 parts of the dimethacrylate ester of a mixture of polyethylene glycols of 200 average molecular weight (representing about 1.6% vinylidene groups on the whole composition), 0.12 part of benzoin methyl ether, 6 parts of dioxane and the theoretically required amount of tris(ethyl acetoacetato) aluminum to form the crosslinked polychelate, and casting the compositions on glass plates. Relief images were prepared from the resulting films as described in detail in the preceding examples.

*Table*

| Polymerizable Polyligand | Mol Ratio | Unit Wgt. per Double Bond | Unit Wgt. per Aceto-Acetate Group | Gel Time | Film Properties | Image |
|---|---|---|---|---|---|---|
| Tetraethylene glycol/pentarythritol/maleate acetoacetate. | 1/1/2/2 | 329 | 329 | 5–10 min | Firm, nontacky gel | Excellent. |
| Diethylene glycol/glycerol/maleate/acetoacetate. | 10/1/10/3 | 221 | 735 | ca. 3 hrs | Clear, soft gel-exudation | Do. |
| Do | 9/2/10/4 | 227 | 568 | 2 hrs | Firm, slightly tacky gel | Do. |
| Diethylene glycol/pentaerythritol/maleate/acetoacetate. | 9/2/10/6 | 253 | 422 | 1–2 hrs | do | Good. |
| Propylene glycol/glycerol/maleate/phthalate/acetoacetate. | 10/1/2. 5/7. 5/3 | 911 | 758 | 3 hrs | Very soft, tacky gel | Poor. |
| Do | 10/1/5/5/3 | 431 | 718 | 3 hrs | do | Do. |

EXAMPLE VIII

A saturated polyester resin containing free hydroxyl groups was prepared by heating a mixture of 41 parts (1 mol) of pentaerythritol, 19 parts (1 mol) of ethylene glycol, and 90 parts (2 mols) of phthalic anhydride at 184° C. for two hours in nitrogen at atmosphere pressure and finally for three hours at 184° C. and 20 mm. pressure. The reaction mixture was then cooled to 150° C. and 40 parts (1 mol) of ethyl acetoacetate in 80 parts of toluene was added. Heating was continued at 120–130° C. until evolution of ethanol as ethanol-toluene binary had ceased. The remainder of the toluene was distilled off at 130–135° C. under reduced pressure. The residue was diluted with an equal volume of ethyl acetate, 34.5 parts of (1.1 mols) of methacryloyl chloride and about 0.02 part of hydroquinone were added, and the solution was heated at 75–80° C. for 30 minutes. The reaction product was then freed of excess methacryloyl chloride by precipitation twice with petroleum ether from ethyl acetate solution. The purified resin was taken up in sufficient ethyl acetate to give a solution containing about 50% solids of the saturated polyester with lateral acetoacetate ligand groups and polymerizable methacrylate groups.

To a cold (5° C.) solution of 40 parts of the above solution (20 parts of polymer) and 0.2 part of benzoin methyl ether was added a cold (5° C.) solution of 3 parts of tris(ethyl acetoacetato)aluminum in 5 parts of ethyl acetate. The resulting mixture was subjected to reduced pressure momentarily to remove air bubbles and immediately cast onto glass plates where a stiff gel formed in a few minutes. After overnight drying there was obtained coated on the plate an about 20-mil colorless, transparent, hard film of the lateral methacryloyloxy substituted polyester polyacetoacetato crosslinked aluminum chelate/photoinitiator composition containing about 4.3% vinylidene groups.

This coated plate was exposed for fifteen minutes to the light source of Example I under a line negative and then developed as in Example IV. The unexposed areas dissolved cleanly, leaving anchored to the glass a sharp relief image of the chelate and addition crosslinked polymer corresponding to the clear areas in the line negative used. The image recesses were deep and the rendition of fine detail was excellent.

EXAMPLE IX

An unsaturated polyester containing free hydroxyl groups was prepared by heating 101 parts (1.1 mols) of glycerol and 98 parts (1 mol) of maleic anhydride together with 0.02 part of hydroquinone at 155° C. for 1.5 hours at atmospheric pressure and then for 1.5 hours at 160° C. and 20 mm. pressure. To this unsaturated polyester was added 65 parts (0.5 mol) of ethyl acetoacetate in 130 parts of toluene and the mixture heated at 135–145° C. under a fractionating column until evolution of ethanol as ethanol-toluene binary had ceased. This required about 1¾ hours. The pressure was then reduced and the mixture heated until no more toluene distilled over. The residue, 226 parts compared to a theoretical yield of 223 parts, was taken up in ethyl acetate to give a solids content of 67%. To this solution was added 92 parts (0.88 mol) of methacryloyl chloride and 0.02 part of hydroquinone and the mixture heated for 30 minutes at 75–80° C. The reaction product was freed from excess methacryloyl chloride as described in Example VIII and finally isolated as a 50% solution in ethyl acetate of the unsaturated polyester with lateral acetoacetate ligand groups and polymerizable methacrylate groups.

To a cold (5° C.) solution of 40 parts of the above solution (20 parts of polymer) and 0.2 part of benzoin methyl ether was added a cold (5° C.) solution of 5 parts of tris(ethyl acetoacetato)aluminum in 10 parts of ethyl acetate and the mixture cast on a glass plate and allowed to gel. After conditioning for three days, there was obtained coated on the plate a hard, clear film of the lateral methacryloyloxy substituted unsaturated polyester polyacetoacetato crosslinked aluminum chelate/photoinitiator composition containing about 5.2% vinylidene groups. Exposure for ten minutes to the light source of Example I under a line negative followed by development as in Example IV to remove unexposed areas gave a sharp, deeply recessed relief image of the chelate and addition crosslinked polymer faithfully duplicating the text of the negative.

EXAMPLE X

Pentaerythritol tetraacetoacetate was prepared by heating 34 parts of pentaerythritol, 143 parts of ethyl acetoacetate, and 80 parts of toluene under a fractionating column until evolution of toluene/ethanol binary ceased. Heating was continued under reduced pressure (20 mm. Hg) to remove the remainder of the toluene and excess ethyl acetoacetate. The oily, slightly yellow residue of pentaerythritol tetraacetoacetate amounted to 116 parts.

To a cold (5° C.) solution of 10 parts of the above pentaerythritol tetraacetoacetate, 10 parts of the monomeric dimethacrylate of a mixture of polyethylene glycols of 200 average molecular weight, and 0.2 part of benzoin methyl ether was added to a cold (5° C.) solution of 11.7 parts of tris(ethyl acetoaceto)aluminum in 10 parts of dioxane. The mixture was cast on a glass plate and allowed to stand at room temperature. After standing overnight, there was obtained coated on the plate a hard, clear layer of the saturated pentaerythritol polyacetoacetato crosslinked aluminum polychelate/dimethacrylate/photoinitiator composition containing about 7.3% vinylidene groups and showing no exudation of the dimethacrylate from the gel.

This coated plate was then covered with a process negative and, while held in a vacuum printing frame, exposed to the light source of Example I. A stepped exposure of 25, 35, and 45 minutes was given. Fan cooling was used to limit the temperature to 45° C. during exposure. After removal of the negative the plate was rocked for ten minutes in a tray of ethyl acetate/ethanol/2,4-pentanedione (85/15/20) with gentle brushing during the last five minutes. A relief image of the crosslinked polychelate/dimethacrylate polymer corresponding to the negative used was thereby obtained. Optimum exposure was in the 35–45 minute range. Sharpness of the image and the depth of recesses were satisfactory.

EXAMPLE XI

The use of ester interchange rather than transchelation to prepare crosslinked compositions is illutrated in this and the following example. A cold (5° C.) solution of 20 parts of a diethylene glycol/glycerol/maleate (9/2/10 molar) polyester, 13.3 parts of diallyl phthalate and 0.33 part of benzoin methyl ether in 8 parts of dioxane was mixed with a cold (5° C.) solution of 6 parts of tris(ethyl acetoacetato)aluminum in 8 parts of dioxane and the mixture poured onto glass plates. Gelation occurred in about 30 minutes and could be speeded by warming the mixture, e.g., less than 30 seconds at 50–60° C. After standing overnight, there was thus obtained coated on the plates a firm, dry film of the unsaturated polyester polyacetoacetato crosslinked aluminum chelate/diallyl phthalate/benzoin methyl ether composition containing about 8.2% vinylidene groups.

Exposure of this layer to the light source of Example I for 15 minutes under a line negative followed by development as in Example IV gave a sharp, hard relief image of the chelate and addition crosslinked polymer with deep recesses. Analysis of the image polymer showed 1.09% aluminum to be present. Polymer from a plate which had been exposed but not treated in the acidic solvent showed an aluminum content of 1.13%. This shows that no appreciable amount of the metal present in the chelate groups of the chelate-crosslinked addition-crosslinked polymer is removed during the "developing" treatment.

EXAMPLE XII

A solution of 2,3-dihydroxypropyl methacrylate was prepared by warming 20 parts of isopropylidene glyceryl methacrylate (prepared as described in U.S. Patent 2,680,735) with 20 parts of dioxane, 1.8 parts of water and a trace of hydrochloric acid. To 25 parts of the above solution containing about 10 parts of 2,3-dihydroxypropyl methacrylate were added 10 parts of the unsaturated polyester of Example XI, 9.5 parts of tris(ethyl acetoaceto)aluminum and 0.2 part of benzoin methyl ether, and the mixture cast onto glass plates and allowed to stand. In about one hour a soft gel had formed and after 24 hours there were obtained coated on the plates clear, tack-free films of the unsaturated polyester polyacetoacetato crosslinked aluminum chelate/methacrylate/photoinitiator composition containing about 7.7% vinylidene groups. After storage for four days in the dark, one of the plates was exposed to the light source of Example I under a line negative. A stepped exposure of 15, 20, and 25 minutes was used after which the image was developed as in Example IV. The relief image of the chelate and addition crosslinked polymer obtained was of good sharpness and excellent hardness with all three exposures. The unexposed areas were removed easily and cleanly.

The present invention is generic to compositions containing a solid polymeric chelate of a polyvalent metal, an addition polymerizable component containing a vinylidene group, and a photoinitiator of addition polymerization. A further aspect of the present invention is that of polyligands containing a plurality of ligand structures and in addition an addition polymerizable ethylenic linkage preferably a vinylidene group or a vinylene group between two esterified carboxyl groups. A still further aspect of the invention is that of polychelates of such polyligands with a polyvalent metal, the valence of the metal plus the number of ligand structures totalling at least 5.

The solid polymeric chelate can be linear or crosslinked, saturated or unsaturated and when unsaturated either internally or terminally, i.e., containing a vinylene or vinylidene group. Any chelate forming polyvalent metal can be used, e.g., those shown by Martell and Calvin, supra, at page 182. Thus, in addition to polychelates of the metals shown in the above examples, there can be used polychelates of other metals such as those of groups II–A through V–A, I–B through VII–B and VIII. Because the compositions are primarily useful in a light initiated addition polymerization process, the colorless or only lightly colored compositions are preferred. Accordingly, it is preferred to use the polychelates of groups II–IV and the more transparent ones of group VIII of the periodic table, both main and sub-groups such as the polychelates of beryllium, magnesium, calcium, barium, cadmium, mercury, scandium, aluminum, gallium, titanium, zirconium, tin, nickel, and the like. For reasons of readier availability and lower cost those of groups II–A, II–B, III–A, IV–A and –B and VIII are preferred. Particularly outstanding are those of beryllium, magnesium, calcium, barium, titanium, nickel and aluminum, especially the latter two.

The polymerizable polymeric polychelates, particularly those with chelate crosslinks are preferred.

Where all or part of the necessary vinylidene groups are furnished by a non-chelate monomer or polymer, either alone or in conjunction with a vinylidene-substituted polychelate, the choice of operable vinylidene compounds is extremely broad, limited only by the general requirement that it be compatible, i.e., capable of forming with the polychelate component and photoinitiator (and any other added component) a substantially homogeneous and transparent composition. In general any vinylidene containing polymer can be used. The vinylidene monomers and low polymers must likewise meet these requirements and in addition must have a minimum boiling point of, i.e., must not boil below 100° C. at atmospheric pressure. Because of their more rapid crosslinking, i.e., the greater speed with which the compositions are rendered insoluble and infusible, the polymerizable vinylidene monomers containing a plurality of such groups are especially preferred. Because of their generally much more rapid rate of polymerization, the vinylidene monomers, including both those having only one such group and a plurality of such groups, are particularly outstanding wherein the said vinylidene group is conjugated with a doubly bonded carbon, including carbon doubly bonded to carbon itself and such heteroatoms as oxygen, nitrogen, and sulfur, e.g., vinylidene containing carboxylic acids, esters, amides, nitriles, sulfonic acids and esters thereof, carboxaldehydes, ethers, and the like. Thus there can be employed unsaturated acids and esters thereof, e.g., acrylic acid, methacrylic acid, ethylene diacrylate, diethylene glycol diacrylate, glycerol, diacrylate, crotyl methacrylate, glycerol triacylate, ethylene dimethacrylate, 1,2-propylene glycol dimethacrylate, 1,2,4-butanetriol trimethacrylate, cyclohexanediol diacrylate, 1,4-benzenediol dimethacrylate, pentaerythritol tetramethacrylate, 1,3-propanediol diacrylate, 1,5-pentanediol dimethacrylate, the bis-acrylates and methacrylates of polyols such as polyethylene glycols of molecular weight 200–500, and the like; unsaturated amides, e.g., acrylamide, methacrylamide, methylene bis-acrylamide, methylene bis-methacrylamide, ethylene bis-methacrylamide, hexane-1,6-diacrylamide, tris-methacrylamide of diethylenetriamine, and the like; vinyl esters, e.g., vinyl benzoate, divinyl succinate, divinyl adipate, divinyl phthalate, divinyl terephthalate, divinyl sebacate, divinyl benzene-1,3-disulfonate, divinyl butane-1,4-disulfonate, and the like; unsaturated aldehydes, e.g., acrylamidoacetaldehyde, β-(methacrylamido)propionaldehyde, α-vinylcrotonaldehyde, α-phenylacrolein, o-acryloyloxybenzaldehyde, m-(α-ethylacrylamido)benzaldehyde, 1-vinyl-4-naphthaldehyde, 2-acrylamido-4-naphthaldehyde, 4-vinyl-4′-formylbiphenyl, p-(2-methacryloyloxyethoxy)benzaldehyde, and the like. The monomers or polymers containing a plurality of conjugated vinylidene groups as described above are particularly outstanding since in polymerized form they can serve to plasticize the polymerized compositions and thereby overcome the tendency of the polymerized polychelates to be brittle.

Thus the preferred photopolymerizable compositions of the present invention are those containing a polymerizable, polymeric polychelate carrying a plurality of vinylidene groups, particularly such a polymer with chelate cross-links; a polymerizable monomer or polymer containing a plurality of vinylidene groups; and a free radical generating addition polymerization initiator activatable by actinic light. Mixtures of all or any of the various type components can be used provided the necessary minimum amount of vinylidene groups is present.

In the preparation of the polymeric chelate any polyvalent metal chelate of any volatile simple chelate-forming agent, i.e., ligand, can be used. The preferred ones naturally are those most available and most economical which are in general the 1,3-diketones, the β-ketoesters and the aromatic o-hydroxy aldehydes and esters. Specific preferred chelating agents include acetylacetone (2,4-pentanedione), benzoylacetone, 3-methyl-2,4-pentanedione, 3-ethyl-2,4-pentanedione, propionylacetone, trifluoroacetylacetone, 2-furoylacetone, 2-thenoylacetone, ethyl acetoacetate, butyl acetoacetate, salicylaldehyde, methyl salicylate, etc. In the case of the aromatic ligands especial care must be taken to remove all the volatile ligand resulting from the formation of the polychelate since such functionally substituted aromatic structures absorb heavily in the light regions most efficient for initiating addition polymerization by formation of free radicals of the initiator and accordingly would slow down the desired polymerization.

For this same reason the starting polyligands preferably should have no such aromatic ligand structures since these remain in any polychelate resulting therefrom and likewise would undesirably affect the light absorption. Thus, the polyligands to be used here should have at least two ligand forming structures per molecule of the types previously discussed here and in the art and particularly those forming chelate rings in which the metal is bonded by one coordinate and one covalent bond. Specific examples of such chelating structures include the following well-known ones, which can be attached to the rest of the polyligand molecule in any suitable manner: β-diketo, β-ketoacyloxy, $$—O—CO—CH_2—CO$$

β-ketooxime,

—CO—C—
   ‖
  NOH

α,β-dioxime,

—C——C—
 ‖     ‖
NOH  NOH thioglycolic acid ester,

|
HOOC—CHSH and the like.

Many of the polyligands employed in this invention are polyhydric alcohol esters containing acyl radicals with ligand forming structures. Such polyligands are readily obtained by esterifying a polyhydric alcohol, e.g., glycerol, pentaerythritol, castor oil, etc., e.g., directly or by ester interchange, with an acid containing a ligand structure, e.g., salicylic acid, benzoylacetic acid, etc., or ester thereof, e.g., ethyl acetoacetate.

Particularly preferred polymeric polychelates are the chelates, with a polyvalent chelating metal, of polyhydric alcohol esters of polycarboxylic acids containing in their molecule acyl residues of α-β-unsaturated acids, monocarboxylic or polycarboxylic, and a plurality of acyl residues of β-keto-monocarboxylic acids.

Practically any initiator or catalyst of addition polymerization which is capable of initiating polymerization under the influence of actinic light can be used in the photopolymerizable polychelate compositions of this invention. Because transparencies transmit both heat and light and the conventional light sources give off heat and light, the preferred initiators of addition polymerization are not activatable thermally. They should be dispersible in the polychelate compositions to the extent necessary for initiating the desired polymerization under the influence of the amount of light energy absorbed in relatively short term exposures. Precautions can be taken to exclude heat rays so as to maintain the photopolymerizable layer at temperatures which are not effective in activating the initiator thermally, but they are troublesome. In addition, exclusion of heat rays makes necessary longer exposure times since the rate of chain propagation in the polymerization reaction is lower at reduced temperatures. For this reason the photoinitiators most useful for this process are those which are not active thermally at temperatures below 80–85° C. These photopolymerization initiators are used in amounts of from 0.05 to 5% and preferably from 0.1 to 2.0% based on the weight of the total polymerizable composition.

Suitable photopolymerization initiators or catalysts include vicinal ketaldonyl compounds, e.g., diacetyl, benzil, etc.; α-ketaldonyl alcohols, e.g., benzoin, pivaloin, etc.; acyloin ethers, e.g., benzoin methyl or ethyl ethers; α-hydrocarbon-substituted aromatic acyloins including α-methylbenzoin, α-allylbenzoin, and α-phenylbenzoin, etc.

An important aspect of the present invention comprises photopolymerizable elements suitable for the preparation of letterpress printing reliefs by the process of the co-pending application of Plambeck, Serial No. 326,841, filed December 19, 1952 (U.S. Patent 2,760,863, dated August 28, 1956). The thickness of the photopolymerizable layer is a direct function of the thickness desired in the relief image and this will depend on the subject being reproduced and particularly on the extent of the non-printing areas. In the case of photopolymerized halftones, the screen used also is a factor. In general, the thickness of the polymerizable layer on the base plate will vary from 0.003 to 0.250 inch. Layers ranging from 0.003 to 0.030 inch in thickness and usually from 0.003 to 0.007 inch are used for halftone plates. Layers ranging from 0.003 to about 0.06 inch in thickness are used for the majority of letterpress printing plates, and it is with these thicknesses that this aspect of this invention is particularly effective. Layers thicker than 0.050–0.060 inch are used for the printing of designs and relatively large areas in letterpress printing plates.

The photopolymerizable layers can obtain immiscible polymeric or non-polymeric organic or inorganic fillers or reinforcing agents which are essentially transparent, e.g., the organophilic silicas, bentonites, silica, powdered glass, etc. having a particle size less than 0.4 mil and in amounts varying with the desired properties of the photopolymerizable layer.

Even when containing monomeric or low polymeric additives as described above, the photopolymerizable compositions of this invention are solids. While their hardness varies from medium hard to very hard, they are nevertheless substantially non-deformable under ordinary conditions, and generally non-tacky. Thus, they offer considerable physical advantages over photopolymerizable compositions obtained as liquids, viscous liquids or flowable gels from the standpoint of forming into convenient elements for commercial printing use.

Actinic light from any source and of any type can be used in carrying out this process. The light may emanate from point sources or be in the form of parallel rays or divergent beams. In order to reduce the exposure time, however, it is preferred to use a broad light source, i.e., one of large area as contrasted to a point source of light, close to the image-bearing transparency from which the relief image is to be made. By using a broad light source, relatively close to the image-bearing transparency, the light rays passing through the clear areas of the transparency enter as divergent beams into the photopolymerizable layer, and thus irradiate a continually diverging area in the photopolymerizable layer underneath the clear portion of the transparency, resulting in the formation of a polymeric relief which is at its greatest width at the bottom surface of the photopolymerized layer, i.e., a frustum, the top surface of the relief being the dimensions of the clear area. Such relief images are advantageous in printing plates because of their greater strength and the smooth continuous slope of their sides as contrasted to the undercut or jagged, irregular nature of the sides of photoengraved reliefs. This is of importance since the smooth sloping reliefs obtained in this process reduce or eliminate the problem of ink-build-up that is always encountered with photoengraved plates.

Inasmuch as the photopolymerization initiators or catalysts, i.e., free radical generating addition polymerization initiators activatable by actinic light generally exhibit their maximum sensitivity in the ultraviolet range, the light source should furnish an effective amount of this radiation. Such sources include carbon arcs, mercury vapor arcs, fluorescent lamps with special ultraviolet light emitting phosphors, argon glow lamps, and photographic flood lamps. Of these, the mercury vapor arcs, particularly the sunlamp type, and the fluorescent sunlamps, are most suitable. Groups of these lamps can be easily arranged to furnish the broad light source required to give a frustum-shaped relief image of good mechanical strength. The sun-lamp mercury vapor arcs are customarily used at a distance of seven to ten inches from the photopolymerizable layer. On the other hand, with a more uniform extended source of low intrinsic brilliance, such as a group of contiguous fluorescent lamps with special phosphors, the plate can be exposed within an inch of the lamps.

The base material used can be any natural or synthetic product capable of existence in film or sheet form and can be flexible or rigid, reflective or non-reflective of actinic light. Because of their generally greater strength in thinner form, e.g., foils, and readier adaptability for use in printing presses, it is preferable to use metals as the base materials. However, where weight is critical, the synthetic resins or superpolymers, particularly the thermoplastic ones, are preferable base materials. In those instances where rotary press plates are desired both types of base or support materials can be used to form flat relief plates which are then formed to the desired shape. The thermoplastic resins or high polymers are particularly suitable base materails in such uses. Such rotary press plates can also be prepared by using cylindrically shaped base plates of the various types carrying the photopolymerizable compositions and exposing them directly through a concentrically disposed image-bearing transparency in like manner.

Suitable base or support materials include metals, e.g., steel and aluminum plates, sheets and foils, and films or plates composed of various film-forming synthetic resins or high polymers, and in particular the vinylidene polymers, e.g., the vinyl chloride polymers, vinylidene chloride copolymers with vinyl chloride, vinyl acetate, styrene, isobutylene and acrylonitrile; and vinyl chloride copolymers with the latter polymerizable monomers; the linear condensation polymers such as the polyesters, e.g., polyethylene terephthalate; the polyamides, e.g., polyhexamethylene sebacamide; polyester amides, e.g., polyhexamethyleneadipamide/adipate; etc. Fillers or reinforcing agents can be present in the synthetic resin or polymer bases such as the various fibers (synthetic, modified, or natural), e.g., cellulosic fibers, for instance, cotton, cellulose acetate, viscose rayon, paper; glass wool; nylon, and the like. These reinforced bases may be used in laminated form.

When highly reflective bases and particularly metal base plates are used any oblique rays passing through clear areas in the image-bearing transparency will strike the surface of the base at an angle other than 90° and after resultant reflection will cause polymerization in non-image areas. The degree of unsharpness in the relief progressively increase as the thickness of the desired relief and the duration of the exposure increases. It has been found that this disadvantage can be overcome when the photopolymerizable composition is deposited on a light-reflective base by having an intervening stratum sufficiently absorptive of actinic light so that less than 35% of the incident light is reflected. This light-absorptive stratum must be adherent to both the photopolymerized image and the base material. A practical method of supplying the layer absorptive of reflected light, or non-halation layer, is to disperse a finely-divided dye or pigment which substantially absorbs actinic light in a solution or aqueous dispersion of a resin or polymer which is adherent to both the support and the photopolymerized image and coating it on the support to form an anchor layer which is dried.

The most useful method for preparing the photosensitive elements of the invention is to apply a chilled solution (40–80% solids) of the components to the prepared substrate and then gel the layer by the application of heat. A convenient way of carrying out such an operation with rigid substrate materials is to apply the solution by the same techniques used to coat glass photographic plates except that heat, rather than cold, is used to gel the layer. Drying to remove solvent and volatile chelating agent (or alcohol if transesterification is employed) is handled in the conventional manner. For flexible substrate materials, roll coating techniques such as are used for application of gelatin-silver halide emulsions to film base can be used. Again gelling is effected by heat. Multiple coatings without intervening drying can be used to furnish the desired thickness.

The solvent liquid used for washing or "developing" the plates made from the photopolymerizable compositions of this invention has been discussed above in detail and must be such that it has good solvent action on the non-insolubilized polychelate composition and has little action on the hardened image or upon the base material, non-halation layer, or anchor layer in the time required to remove the non-insolubilized portions. The simple ligands such as the 1,3-diketones, $\beta$-ketoacid esters, etc. are particularly preferred.

This invention provides a simple, effective process for producing letterpress printing plates from inexpensive materials and with a marked reduction in labor requirements over the conventional photoengraving procedure. The images obtained are sharp and show fidelity to the original transparency both in small details and in overall dimensions. In addition, the process allows the preparation of many types of ruled line plates which could ordinarily be handled only by the tedious wax engraving technique. Moreover, these photopolymerized plates allow much more efficient use of valuable press time since the flatness of the printing surfaces reduces the amount of make-ready required on the press. The smooth, clean, regularly tapered shoulders of the image minimize ink buildup during use and save much of the time spent in cleaning operations during a press run. An important commercial advantage is their lightness in weight.

The photopolymerized printing plates can serve as originals for the preparation of stereotypes or electrotypes although in the latter case if only duplicates are desired it is much more convenient and economical to make duplicate photopolymerized plates. Curved plates for use on rotary presses can be prepared easily by bending the flat plates which have been heated sufficiently (generally from 100° to 120° C.) to soften the image layer. It is also possible to prepare curved plates directly by polymerization against a curved negative surface.

The printing elements of this invention can be used in all classes of printing but are most applicable to those classes of printing wherein a distinct difference of height between printing and non-printing areas, and those wherein the ink is carried by the recessed portions of the relief such as in intaglio printing, e.g., line and inverted halftone. The plates are obviously useful for multicolor printing.

The use of the polychelate based, vinylidene-substituted compositions of this invention as elements suitable for preparation of printing reliefs by photopolymerization has been described at length in view of its importance. These compositions, however, are also suitable for other applications in which readily insolubilized, solid, polymeric compositions are useful, such as the preparation of binders for television phosphors.

A polymerizable (or copolymerizable) internal double bond confers on the compound containing the same the capability of polymerization, usually copolymerization, with a vinylidene containing compound, e.g., styrene, to high polymers, i.e., polymers of molecular weight of 10,000 or above.

The foregoing detailed description has been given for clearness of understanding only and no unnecessary limitations are to be understood therefrom. The invention is not limited to the exact details shown and described for obvious modifications will occur to those skilled in the art.

The embodiments of the invention in which an exclusive property or privilege is claimed are defined as follows:

1. A solid, essentially transparent photopolymerizable composition comprising: (1) at least 50% by weight of a polymeric crosslinked polyvalent metal chelate of a polymeric polyhydric alcohol-polycarboxylic acid condensation product modified by further esterification of a plurality, *m*, of hydroxyl groups thereof with a beta-ketomonocarboxylic acid having hydrogen on the alpha-carbon, the polyvalent metal being taken from the class consisting of the metals of groups II–A through V–A, I–B through VII–B, and VIII of the periodic table and having an absolute valence *n*, both *m* and *n* being plural integers and totalling at least 5, the unit weight of said polyhydric alcohol ester being less than 1000 for each beta-ketomonocarboxylic acid ester group, said chelate being crosslinked through said polyvalent metal present in six-membered chelate rings formed on different polymer chains, said metal being a common member of said chelate rings, each of said rings having an atom of the polyvalent metal linked to both the carbonylic and carboxylic oxygen atoms of a single beta-ketoacyloxy unit; (2) at least one addition polymerizable, ethylenically unsaturated compound containing at least one vinylidene group, having a minimum boiling point of 100° at atmospheric pressure, and being present in amount such that the vinylidene group constitutes at least 1% up to about 8.0%; and (3) an addition polymerization initiator activatable by actinic light in amount from 0.05 to 5%, said percentages being by weight of the entire composition.

2. A composition as defined in claim 1 wherein said initiator is activatable by actinic light and is inactive thermally below 85° C.

3. A composition as defined in claim 1 wherein the polyvalent metal chelate contains a vinylidene group.

4. A composition as defined in claim 1 wherein the addition polymerizable compound contains a plurality of vinylidene groups.

5. A composition as defined in claim 1 wherein said polyhydric alcohol ester comprises a pentaerythritol phthalate/acetoacetate/methacrylate.

6. A composition as defined in claim 1 wherein said polyhydric alcohol ester is internally unsaturated and has a unit weight per ligand unit less than 1000 and per internal double bond less than 500.

7. A composition as defined in claim 1 wherein said polyhydric alcohol ester is of a maleic and acetoacetic acid ester of a polyhydric alcohol having at least three alcoholic hydroxyl groups.

8. A composition as defined in claim 1 wherein said vinylidene compound is a polyethylene glycol ester of methacrylic acid.

9. A composition as defined in claim 1 wherein said metal is one of group III–A of the periodic table.

10. A photopolymerizable element comprising a sheet support and a layer of the solid photopolymerizable composition defined in claim 1.

11. A photopolymerizable element as set forth in claim 10 wherein said layer is 3 to 250 mils in thickness.

12. A photopolymerizable element as defined in claim 10 wherein said layer has an optical density to actinic light less than 5 and less than 0.5 per mil.

13. A process of making a printing relief which comprises exposing to actinic light through an image-bearing transparency consisting of essentially opaque and essentially transparent areas a photopolymerizable element as defined in claim 10 until substantial polymerization occurs in the exposed areas but without any substantial polymerization in the areas in the layer corresponding to the said substantially opaque areas and removing said composition from said layer in the unexposed areas.

References Cited in the file of this patent

UNITED STATES PATENTS

| | | |
|---|---|---|
| 2,407,290 | Pursell | Sept. 10, 1946 |
| 2,484,431 | Staehle et al. | Oct. 11, 1949 |
| 2,551,050 | Pinkston | May 1, 1951 |
| 2,620,325 | Langkammerer | Dec. 2, 1952 |
| 2,634,253 | Maynard | Apr. 7, 1953 |
| 2,641,576 | Sachs et al. | June 9, 1953 |
| 2,647,106 | Engelhardt | July 28, 1953 |
| 2,659,711 | Wilkins et al. | Nov. 17, 1953 |
| 2,673,151 | Gerhart | Mar. 23, 1954 |
| 2,697,700 | Uraneck et al. | Dec. 21, 1954 |
| 2,707,709 | Buchdahl | May 3, 1955 |
| 2,734,044 | Bezman et al. | Feb. 7, 1956 |
| 2,791,504 | Plambeck | May 7, 1957 |
| 2,933,475 | Hoover et al. | Apr. 19, 1960 |

OTHER REFERENCES

Bailar: Chemistry of the Coordination Compounds, Rheinhold Pub. Corp., copyright 1956, pages 96 and 97.